United States Patent
Qian (10) Patent No.: US 10,438,554 B2
(45) Date of Patent: Oct. 8, 2019

(54) SHIFT REGISTER AND DRIVING METHOD THEREOF, GATE ON ARRAY CIRCUIT AND DISPLAY APPARATUS

(71) Applicants: BOE Technology Group Co., Ltd., Beijing (CN); Hefei Xinsheng Optoelectronics Technology Co., Ltd., Anhui (CN)

(72) Inventor: Xianrui Qian, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 162 days.

(21) Appl. No.: 15/788,116

(22) Filed: Oct. 19, 2017

(65) Prior Publication Data

US 2018/0122321 A1    May 3, 2018

(30) Foreign Application Priority Data

Oct. 31, 2016  (CN) .......................... 2016 1 0930979

(51) Int. Cl.
   *G11C 19/00*    (2006.01)
   *G09G 3/36*     (2006.01)
   *G11C 19/28*    (2006.01)

(52) U.S. Cl.
   CPC .......... *G09G 3/3677* (2013.01); *G11C 19/28* (2013.01); *G09G 2310/0248* (2013.01); *G09G 2310/0286* (2013.01); *G09G 2310/0289* (2013.01); *G09G 2310/08* (2013.01); *G09G 2320/0252* (2013.01)

(58) Field of Classification Search
   None
   See application file for complete search history.

(56) References Cited

U.S. PATENT DOCUMENTS

| 2016/0300542 | A1* | 10/2016 | Zhang | ............... G11C 19/28 |
| 2017/0116924 | A1* | 4/2017 | Zhang | ............... G09G 3/3233 |
| 2018/0204628 | A1* | 7/2018 | Gao | ............... G09G 3/2003 |
| 2018/0218660 | A1* | 8/2018 | Wang | ............... G09G 3/20 |

* cited by examiner

*Primary Examiner* — Tuan T Lam
(74) *Attorney, Agent, or Firm* — Nath, Goldberg & Meyer; Joshua B. Goldberg (57) ABSTRACT

Provided are a shift register and a driving method thereof, a gate on array circuit and a display apparatus. The shift register includes a pre-charging module, an output module, a reset module and a reset control module. The pre-charging module is configured to charge a first node in a pre-charging period. The output module is configured to pull up a voltage at the first node and output a driving signal through the output signal terminal in an output period. The reset control module is configured to pull up a voltage at the second node by the driving signal outputted through the output signal terminal in the output period and output the voltage at the second node pulled up in the output period to the reset module as a reset signal in a reset period.

19 Claims, 3 Drawing Sheets

SHIFT REGISTER AND DRIVING METHOD THEREOF, GATE ON ARRAY CIRCUIT AND DISPLAY APPARATUS

CROSS-REFERENCE TO RELATED APPLICATIONS

The present application claims the priority of Chinese Patent Application No. 201610930979.1, filed on Oct. 31, 2016, the contents of which are incorporated herein in their entirety by reference.

TECHNICAL FIELD

The present disclosure relates to the field of display technology, and particularly to a shift register and driving method thereof, a gate on array circuit and a display apparatus.

BACKGROUND

In the field of liquid crystal display technology, in order to pursue low cost, narrow bezel, less process steps, simple processing technology and other characteristics, the LCD industry is increasingly paying attention to and conducting research on gate drive circuits on an array substrate (namely, gate on array circuits, simply referred to as GOA circuits), which have been successfully applied to liquid crystal display apparatuses and related products.

In the related art, due to the limitation of the GOA's logic circuit itself, it needs in the GOA circuit to use a driving signal outputted from an output signal terminal of a shift register in the next stage as a reset signal of a shift register in the current stage to discharge a capacitor of the shift register in the current stage, so as to realize reset function.

In other words, according to the solution in the related art, the reset function can be realized only by the driving signal outputted from the output signal terminal of the shift register in the next stage.

SUMMARY

At least one embodiment of the present disclosure provides a shift register and a driving method thereof, a gate on array circuit and a display apparatus for realizing reset function under control of a driving signal outputted through an output signal terminal of the shift register itself, so that the shift register can realize reset function on its own.

To achieve at least the above object, at least one embodiment of the present disclosure provides a shift register including a pre-charging module, an output module, a reset module and a reset control module. The pre-charging module is connected to a first node, the output module is connected to the first node and an output signal terminal, the reset module is connected to a second node, the first node and the output signal terminal, and the reset control module is connected to the second node and the output signal terminal;

the pre-charging module is configured to charge the first node in a pre-charging period;

the output module is configured to pull up a voltage at the first node and output a driving signal through the output signal terminal in an output period;

the reset control module is configured to pull up a voltage at the second node by the driving signal outputted through the output signal terminal in the output period and output the voltage at the second node pulled up in the output period to the reset module as a reset signal in a reset period; and the reset module is configured to reset the first node and the output signal terminal under control of the reset signal in the reset period.

Optionally, the reset control module includes a thirteenth transistor, a fourteenth transistor, a fifteenth transistor, a sixteenth transistor and a second capacitor;

a control electrode of the thirteenth transistor is connected to a fifth node, a first electrode of the thirteenth transistor is connected to a sixth node, and a second electrode of the thirteenth transistor is connected to the fifth node;

a control electrode of the fourteenth transistor is connected to the fifth node, a first electrode of the fourteenth transistor is connected to the second node, and a second electrode of the fourteenth transistor is connected to a reference signal terminal;

a control electrode of the fifteenth transistor is connected to the sixth node, a first electrode of the fifteenth transistor is connected to the second node, and a second electrode of the fifteenth transistor is connected to the sixth node;

a control electrode of the sixteenth transistor is connected to a first clock signal terminal, a first electrode of the sixteenth transistor is connected to the output signal terminal, and a second electrode of the sixteenth transistor is connected to the fifth node; and a first end of the second capacitor is connected to the reference signal terminal and a second end of the second capacitor is connected to the sixth node.

Optionally, the reset control module is further connected to a reset signal terminal; and the reset control module is further configured to pull up the voltage at the second node by a reset assistant signal inputted through the reset signal terminal in the reset period, such that the voltage at the second node in the reset period is not lower than the voltage at the second node in the output period.

Optionally, the reset control module includes a thirteenth transistor, a fourteenth transistor, a fifteenth transistor, a sixteenth transistor, a seventeenth transistor, an eighteenth transistor and a second capacitor;

a control electrode of the thirteenth transistor is connected to a fifth node, a first electrode of the thirteenth transistor is connected to a sixth node, and a second electrode of the thirteenth transistor is connected to the fifth node;

a control electrode of the fourteenth transistor is connected to the fifth node, a first electrode of the fourteenth transistor is connected to the second node, and a second electrode of the fourteenth transistor is connected to a reference signal terminal;

a control electrode of the fifteenth transistor is connected to the sixth node, a first electrode of the fifteenth transistor is connected to the second node, and a second electrode of the fifteenth transistor is connected to the sixth node;

a control electrode of the sixteenth transistor is connected to a first clock signal terminal, a first electrode of the sixteenth transistor is connected to the output signal terminal, and a second electrode of the sixteenth transistor is connected to the fifth node;

a control electrode of the seventeenth transistor is connected to the reset signal terminal, a first electrode of the seventeenth transistor is connected to the reset signal terminal, and a second electrode of the seventeenth transistor is connected to a seventh node;

a control electrode of the eighteenth transistor is connected to the fifth node, a first electrode of the eighteenth transistor is connected to the seventh node, and a second electrode of the eighteenth transistor is connected to the reference signal terminal; and a first end of the second capacitor is connected to the seventh node and a second end of the second capacitor is connected to the sixth node.

Optionally, the reset control module further includes a nineteenth transistor; and a control electrode of the nineteenth transistor is connected to a second clock signal terminal, a first electrode of the nineteenth transistor is connected to the reference signal terminal, and a second electrode of the nineteenth transistor is connected to the fifth node.

Optionally, the reset module includes a first transistor, a third transistor, a fourth transistor, a fifth transistor, a sixth transistor, a seventh transistor, an eighth transistor, a ninth transistor, an eleventh transistor and a twentieth transistor;

a control electrode of the first transistor is connected to the second node, a first electrode of the first transistor is connected to the output signal terminal, and a second electrode of the first transistor is connected to a reference signal terminal;

a control electrode of the third transistor is connected to a ninth node, a first electrode of the third transistor is connected to the output signal terminal, and a second electrode of the third transistor is connected to the reference signal terminal;

a control electrode of the fourth transistor is connected to a second clock signal terminal, a first electrode of the fourth transistor is connected to the output signal terminal, and a second electrode of the fourth transistor is connected to the reference signal terminal;

a control electrode of the fifth transistor is connected to the first node, a first electrode of the fifth transistor is connected to the ninth node, and a second electrode of the fifth transistor is connected to the reference signal terminal;

a control electrode of the sixth transistor is connected to a second electrode of the twentieth transistor, a first electrode of the sixth transistor is connected to the first node, and a second electrode of the sixth transistor is connected to the reference signal terminal;

a control electrode of the seventh transistor is connected to the second clock signal terminal, a first electrode of the seventh transistor is connected to the second clock signal terminal, and a second electrode of the seventh transistor is connected to a third node;

a control electrode of the eighth transistor is connected to the ninth node, a first electrode of the eighth transistor is connected to the first node, and a second electrode of the eighth transistor is connected to the reference signal terminal;

a control electrode of the ninth transistor is connected to the first node, a first electrode of the ninth transistor is connected to the third node, and a second electrode of the ninth transistor is connected to the reference signal terminal;

a control electrode of the eleventh transistor is connected to the third node, a first electrode of the eleventh transistor is connected to the second clock signal terminal, and a second electrode of the eleventh transistor is connected to the ninth node; and a control electrode of the twentieth transistor is connected to the second clock signal terminal, a first electrode of the twentieth transistor is connected to the second node, and the second electrode of the twentieth transistor is connected to the control electrode of the sixth transistor.

Optionally, the output module includes a second transistor and a first capacitor;

a control electrode of the second transistor is connected to the first node, a first electrode of the second transistor is connected to a first clock signal terminal, and a second electrode of the second transistor is connected to the output signal terminal;

a first end of the first capacitor is connected to the first node, and a second end of the first capacitor is connected to the output signal terminal.

Optionally, the pre-charging module includes a tenth transistor and a twelfth transistor;

a control electrode of the tenth transistor is connected to an input signal terminal, a first electrode of the tenth transistor is connected to the input signal terminal, and a second electrode of the tenth transistor is connected to the first node; and a control electrode of the twelfth transistor is connected to a second clock signal terminal, a first electrode of the twelfth transistor is connected to the input signal terminal, and a second electrode of the twelfth transistor is connected to the first node.

To achieve at least the above object, at least one embodiment of the present disclosure provides a gate on array (GOA) circuit including a plurality of the above-described shift registers cascaded in a multi-stage series.

To achieve at least the above object, at least one embodiment of the present disclosure provides a display apparatus including the above-described GOA circuit.

To achieve at least the above object, an embodiment of the present disclosure provides a driving method of a shift register, wherein the shift register includes a pre-charging module, an output module, a reset module and a reset control module, the pre-charging module is connected to a first node, the output module is connected to the first node and an output signal terminal, the reset module is connected to a second node, the first node and the output signal terminal, and the reset control module is connected to a second node and the output signal terminal;

the driving method includes:

in a pre-charging period, charging the first node by the pre-charging module;

in an output period, pulling up a voltage at the first node and outputting a driving signal through the output signal terminal by the output module, and pulling up a voltage at the second node by the reset control module through the driving signal outputted through the output signal terminal; and in a reset period, outputting, by the reset control module, the voltage at the second node pulled up in the output period to the reset module as a reset signal, and resetting the first node and the output signal terminal by the reset module under control of the reset signal.

Optionally, the reset control module is further connected to a reset signal terminal; and the method further includes, before outputting the reset signal to the reset module through the second node by the reset control module:

in the reset period, pulling up, by the reset control module, the voltage at the second node through a reset assistant signal inputted through the reset signal terminal, such that the voltage at the second node in the reset period is not lower than the voltage at the second node in the output period.

The pre-charge period, the output period and the reset period are three periods sequential and consecutive in time.

DETAILED DESCRIPTION

To make those skilled in the art better understand the technical solutions of the present disclosure, a shift register and a driving method thereof, a gate on array circuit and a display apparatus according to the present disclosure will be further described in detail below in conjunction with the accompanying drawings.

Figure 1:
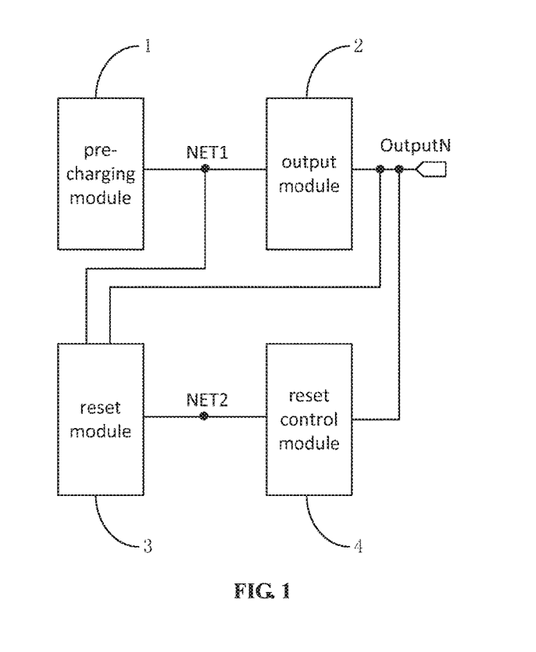
FIG. 1 is a schematic diagram illustrating a structure of a shift register according to an embodiment of the present disclosure.

FIG. 1 is a schematic diagram illustrating a structure of a shift register according to an embodiment of the present disclosure. As illustrated in FIG. 1, the shift register includes a pre-charging module 1, an output module 2, a reset module 3 and a reset control module 4. The pre-charging module 1 is connected to a first node NET1, the output module 2 is connected to the first node NET1 and an output signal terminal OutputN, the reset module 3 is connected to a second node NET2, the first node NET1 and the output signal terminal OutputN, and the reset control module 4 is connected to the second node NET2 and the output signal terminal OutputN.

The pre-charging module 1 is configured to charge the first node NET1 in a pre-charging period. The output module 2 is configured to pull up a voltage at the first node NET1 and output a driving signal through the output signal terminal in an output period. The reset control module 4 is configured to, in the output period, pull up a voltage at the second node NET2 by the driving signal outputted through the output signal terminal OutputN, and, in a reset period, output the voltage at the second node NET2 pulled up in the output period to the reset module 3 as a reset signal. The reset module 3 is configured to reset the first node NET1 and the output signal terminal OutputN under control of the reset signal in the reset period.

In the shift register according to the present embodiment, the reset control module pulls up the voltage at the second node by the driving signal outputted through the output signal terminal in the output period and outputs the reset signal to the reset module through the second node in the reset period, and the reset module resets the first node and the output signal terminal under control of the reset signal in the reset period. The shift register in the present embodiment realizes reset function under control of the driving signal outputted through its own output signal terminal, so that the shift register realizes reset function on its own. The shift register in the present embodiment realizes reset function by the driving signal outputted through its own output signal terminal, and thus it needs no dummy signal line to reset the shift register in the last stage, resulting in less complexity of the structure of GOA circuit and less space occupied by the GOA circuit in the display apparatus.

Figure 2:
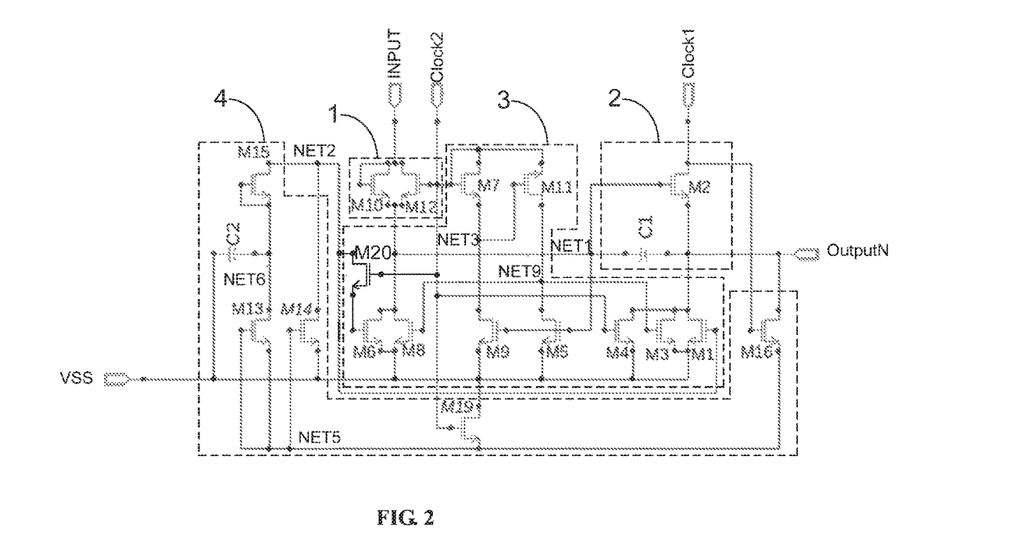
FIG. 2 is a schematic diagram illustrating a structure of a shift register according to an embodiment of the present disclosure.

FIG. 2 is a schematic diagram illustrating a structure of a shift register according to an embodiment of the present disclosure. Referring to FIGS. 1 and 2, the reset control module 4 includes a thirteenth transistor M13, a fourteenth transistor M14, a fifteenth transistor M15, a sixteenth transistor M16 and a second capacitor C2. A control electrode of the thirteenth transistor M13 is connected to a fifth node NET5, a first electrode of the thirteenth transistor M13 is connected to a sixth node NET6, and a second electrode of the thirteenth transistor M13 is connected to the fifth node NET5. A control electrode of the fourteenth transistor M14 is connected to the fifth node NET5, a first electrode of the fourteenth transistor M14 is connected to the second node NET2, and a second electrode of the fourteenth transistor M14 is connected to a reference signal terminal VSS. A control electrode of the fifteenth transistor M15 is connected to the sixth node NET6, a first electrode of the fifteenth transistor M15 is connected to the second node NET2, and a second electrode of the fifteenth transistor M15 is connected to the sixth node NET6. A control electrode of the sixteenth transistor M16 is connected to a first clock signal terminal Clock1, a first electrode of the sixteenth transistor M16 is connected to the output signal terminal OutputN, and a second electrode of the sixteenth transistor M16 is connected to the fifth node NET5. A first end of the second capacitor C2 is connected to the reference signal terminal VSS, and a second end of the second capacitor C2 is connected to the sixth node NET6.

Optionally, the reset control module 4 further includes a nineteenth transistor M19. A control electrode of the nineteenth transistor M19 is connected to a second clock signal terminal Clock2, a first electrode of the nineteenth transistor M19 is connected to the reference signal terminal VSS, and a second electrode of the nineteenth transistor M19 is connected to the fifth node NET5.

The reset module 3 includes a first transistor M1, a third transistor M3, a fourth transistor M4, a fifth transistor M5, a sixth transistor M6, a seventh transistor M7, an eighth transistor M8, a ninth transistor M9, an eleventh transistor M11 and a twentieth transistor M20. A control electrode of the first transistor M1 is connected to the second node NET2, a first electrode of the first transistor M1 is connected to the output signal terminal OutputN, and a second electrode of the first transistor M1 is connected to the reference signal terminal VSS. A control electrode of the third transistor M3 is connected to a ninth node NET9, a first electrode of the third transistor M3 is connected to the output signal terminal OutputN, and a second electrode of the third transistor M3 is connected to the reference signal terminal VSS. A control electrode of the fourth transistor M4 is connected to the second clock signal terminal Clock2, a first electrode of the fourth transistor M4 is connected to the output signal terminal OutputN, and a second electrode of the fourth transistor M4 is connected to the reference signal terminal VSS. A control electrode of the fifth transistor M5 is connected to the first node NET1, a first electrode of the fifth transistor M5 is connected to the ninth node NET9, and a second electrode of the fifth transistor M5 is connected to the reference signal terminal VSS. A control electrode of the sixth transistor M6 is connected to a second electrode of the twentieth transistor M20, a first electrode of the sixth transistor M6 is connected to the first node NET1, and a second electrode of the sixth transistor M6 is connected to the reference signal terminal VSS. A control electrode of the seventh transistor M7 is connected to the second clock signal terminal Clock2, a first electrode of the seventh transistor M7 is connected to the second clock signal terminal Clock2, and a second electrode of the seventh transistor M7 is connected to a third node NET3. A control electrode of the eighth transistor M8 is connected to the ninth node NET9, a first electrode of the eighth transistor M8 is connected to the first node NET1, and a second electrode of the eighth transistor M8 is connected to the reference signal terminal VSS. A control electrode of the ninth transistor M9 is connected to the first node NET1, a first electrode of the ninth transistor M9 is connected to the third node NET3, and a second electrode of the ninth transistor M9 is connected to the reference signal terminal VSS. A control electrode of the eleventh transistor M11 is connected to the third node NET3, a first electrode of the eleventh transistor M11 is connected to the second clock signal terminal Clock2, and a second electrode of the eleventh transistor M11 is connected to the ninth node NET9. A control electrode of the twentieth transistor M20 is connected to the second clock signal terminal Clock2, a first electrode of the twentieth transistor M20 is connected to the second node NET2, and the second electrode of the twentieth transistor M20 is connected to the control electrode of the sixth transistor M6.

The output module 2 includes a second transistor M2 and a first capacitor C1. A control electrode of the second transistor M2 is connected to the first node NET1, a first electrode of the second transistor M2 is connected to the first clock signal terminal Clock1, and a second electrode of the second transistor M2 is connected to the output signal terminal OutputN. A first end of the first capacitor C1 is connected to the first node NET1, and a second end of the first capacitor C1 is connected to the output signal terminal OutputN.

The pre-charging module 1 includes a tenth transistor M10 and a twelfth transistor M12. A control electrode of the tenth transistor M10 is connected to an input signal terminal INPUT, a first electrode of the tenth transistor M10 is not connected to the input signal terminal INPUT, and a second electrode of the tenth transistor M10 is connected to the first node NET1. A control electrode of the twelfth transistor M12 is connected to the second clock signal terminal Clock2, a first electrode of the twelfth transistor M12 is connected to the input signal terminal INPUT, and a second electrode of the twelfth transistor M12 is connected to the first node NET1.

In the present embodiment, the first to twentieth transistors M1-M20 each are thin film transistors (simply referred to as TFTs).

Figure 3:
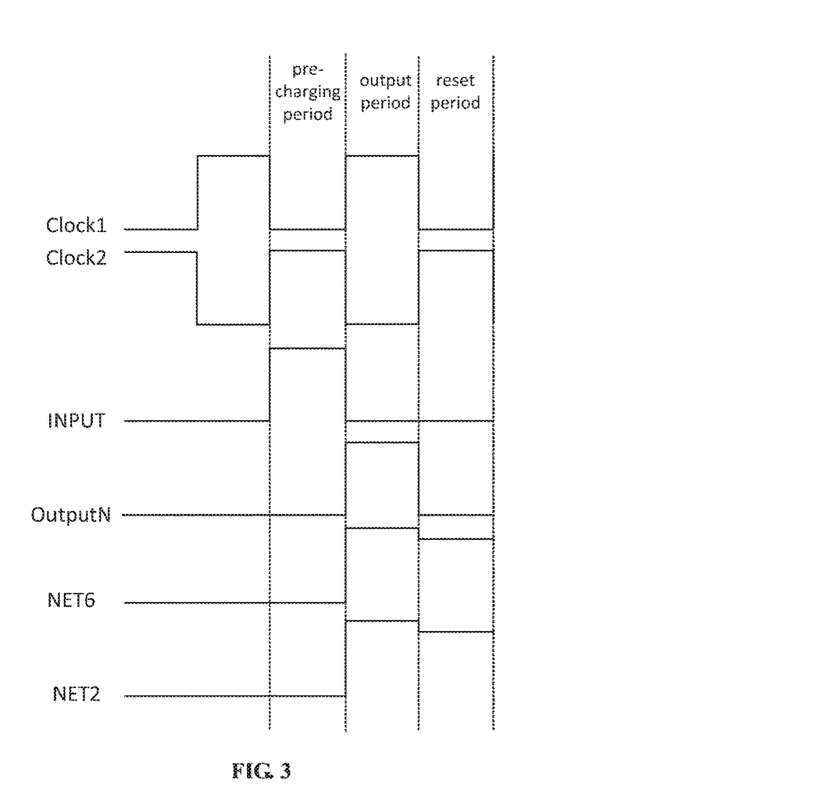
FIG. 3 is a schematic diagram illustrating a timing of the shift register of FIG. 2 in an operating mode.

FIG. 3 is a schematic diagram illustrating a timing of the shift register of FIG. 2 in an operating mode. Hereinafter, an operating process of the shift register according to the present embodiment will be described in detail with reference to FIGS. 2 and 3.

In the pre-charging period, the tenth transistor M10 is turned on under control of the control signal inputted through the input signal terminal INPUT, wherein the input signal terminal INPUT may be connected with the output signal terminal Output(N-1) of the shift register in the previous stage, and in this case, the control signal is the driving signal outputted through the output signal terminal Output(N-1) of the shift register in the previous stage, which is a high-level signal. It should be noted that in a case where the current shift register is a shift register in the first stage, the input signal terminal INPUT thereof may be connected with a start vertical (STV) signal terminal of the GOA circuit, and in this case, the control signal may be a STV signal outputted through the STV signal terminal. In this period, a second clock signal inputted through the second clock signal terminal Clock2 is a high-level signal, and the twelfth transistor M12, the seventh transistor M7, the fourth transistor M4, the nineteenth transistor M19 and the twentieth transistor M20 are turned on under control of the second clock signal. Due to the on state of the tenth and twelfth transistors M10 and M12, the first capacitor C1 is charged via the tenth and twelfth transistors M10 and M12 from the input signal terminal INPUT, so that the voltage at the first node NET1 is pulled up and the second, fifth and ninth transistors M2, M5 and M9 are turned on under control of the voltage at the first node NET1. In the present embodiment, the twelfth transistor M12 is provided to improve the signal writing capability of the input signal terminal INPUT. Since the second clock signal is at high level and the seventh transistor M7 is turned on, a voltage at the third node NET3 is at high level, and the eleventh transistor M11 is turned on under control of the voltage at the third node NET3. Since a voltage at the reference signal terminal VSS is at low level and the fifth transistor M5 is turned on, the ninth node NET9 is discharged via the fifth transistor M5. In this case, a width-to-length ratio of the fifth transistor M5 is appropriately set (for example, the width-to-length ratio of the fifth transistor M5 is set to be much larger than that of the eleventh transistor M11) to ensure that a voltage at the ninth node NET9 is pulled down to low level by the fifth transistor M5 and the third and eighth transistors M3 and M8 are turned off under control of the voltage at the ninth node NET9. Although the second transistor M2 is turned on, a voltage at the output signal terminal OutputN is at low level due to the fact that the first clock signal inputted through the first clock signal terminal Clock1 is a low-level signal. The voltage at the reference signal terminal VSS is at low level, and thus the output signal terminal OutputN is discharged via the fourth transistor M4 that is turned on to ensure that the voltage at the output signal terminal OutputN is at low level. The eighth transistor M8 is turned off to not discharge the first node NET1, so it ensures that the voltage at the first node NET1 is at high level. Due to the low level of the first clock signal inputted through the first clock signal terminal Clock1, the sixteenth transistor M16 is turned off, and thus the voltage at the fifth node NET5 is at low level and the thirteenth and fourteenth transistors M13 and M14 are turned off. A voltage at the sixth node NET6 is at low level as well, and thus the fifteenth transistor M15 is turned off. Although the twentieth transistor M20 is turned on, the sixth transistor M6 is turned off due to the low level of the voltage at the second node NET2. The first transistor M1 is turned off due to the low level of the voltage at the second node NET2. Due to the low level of the voltage at the reference signal terminal VSS, the fifth node NET5 is discharged via the nineteenth transistor M19 that is turned on to ensure that the voltage at the fifth node NET5 is at low level.

In the output period, the second transistor M2 remains on under control of the voltage at the first node NET1, and the first clock signal outputted through the first clock signal terminal Clock1 is at high level to pull up the voltage at the output signal terminal OutputN to high level, so the voltage at the first node NET1 is pulled up due to the bootstrapping effect. Therefore, a driving signal of high level is outputted through the output signal terminal OutputN. The sixteenth transistor M16 is turned on under control of the first clock signal, and the voltage at the fifth node NET5 is at high level because the driving signal outputted through the output signal terminal OutputN is a high-level signal. The thirteenth and fourteenth transistors M13 and M14 are turned on under control of the voltage at the fifth node NET5, and in this case, the second capacitor C2 is charged via the thirteenth transistor M13 that is on, such that the voltage at the sixth node NET6 is at high level. At this moment, the voltage at the reference signal terminal VSS is at low level to ensure the high level of the voltage at the sixth node NET6. The fifteenth transistor M15 is turned on under control of the sixth node NET6 such that the voltage at the second node NET2 is at high level. In the present embodiment, the voltages at the sixth node NET6 and the second node NET2 can be controlled by setting a width-to-length ratio W/L of the fourteenth transistor M14. The control signal inputted through the input signal terminal INPUT is a low-level signal, and thus the tenth transistor M10 is turned off under control of the control signal. The second clock signal inputted through the second clock signal terminal Clock2 is a low-level signal, and thus the twelfth transistor M12, the seventh transistor M7, the fourth transistor M4, the nineteenth transistor M19 and the twentieth transistor M20 are turned off under control of the second clock signal. The voltage at the third node NET3 is at low level due to the off state of the seventh transistor M7, so the eleventh transistor M11 is turned off under control of the voltage at the third node NET3. The fifth and ninth transistors M5 and M9 remain on under control of the voltage at the first node NET1, the voltage at the reference signal terminal VSS is at low level, the voltage at the ninth node NET9 is at low level, and the third and eighth transistors M3 and M8 are turned off under control of the voltage at the ninth node NET9. Although the voltage at the second node NET2 is at high level, the sixth transistor M6 is not turned on by the voltage at the second node NET2 due to the off of the twentieth transistor M20, i.e., the sixth transistor M6 is in the off state. The first transistor M1 is turned on under control of the voltage at the second node NET2. Although the output signal terminal OutputN is somewhat discharged via the first transistor M1, the voltage at the output signal terminal OutputN is not affected by the discharge because the on-resistance of the first transistor M1 is larger than that of the second transistor M2.

In the reset period, the first clock signal inputted through the first clock signal terminal Clock1 is at low level, the sixteenth transistor M16 is turned off under control of the first clock signal, and at this moment, the driving signal outputted through the output signal terminal OutputN is a low-level signal. The voltage at the fifth node NET5 is at low level due to the off state of the sixteenth transistor M16. The thirteenth and fourteenth transistors M13 and M14 are turned off under control of the voltage at the fifth node NET5. The voltage at the sixth node NET6 is maintained at high level by the second capacitor C2, and as illustrated in FIG. 3, the voltage at the sixth node NET6 is slightly decreased due to the discharge of the second capacitor C2. The fifteenth transistor M15 remains on under control of the voltage at the sixth node NET6, so that the voltage at the second node NET2 remains at high level, and the voltage at the sixth node NET6 is the same as the voltage at the second node NET2. The second clock signal outputted through the second clock signal terminal Clock2 is a high-level signal, and the twelfth transistor M12, the seventh transistor M7, the fourth transistor M4, the nineteenth transistor M19 and the twentieth transistor M20 are turned on under control of the second clock signal. Due to the on state of the twentieth transistor M20, a reset signal of high level is outputted from the second node NET2 to the sixth transistor M6 via the twentieth transistor M20. The sixth transistor M6 is turned on under control of the reset signal, that is, the sixth transistor M6 is turned on under control of the voltage at the second node NET2. The reset signal of high level is outputted from the second node NET2 to the sixth transistor M6, and the first transistor M1 is turned on under control of the reset signal, that is, the first transistor M1 is turned on under control of the voltage at the second node NET2. Due to the on state of the seventh transistor M7, the voltage at the third node NET3 is at high level, the eleventh transistor M11 is turned on under control of the voltage at the third node NET3, and thus the voltage at the ninth node NET9 is at high level. The third and eighth transistors M3 and M8 are turned on under control of the voltage at the ninth node NET9. The voltage at the reference signal terminal VSS is at low level, the first node NET1 is discharged via the sixth and eighth transistors M6 and M8 such that the voltage at the first node NET1 becomes low level, and the output signal terminal OutputN is discharged via the first, third and fourth transistors M1, M3 and M4 such that the voltage at the output signal terminal OutputN becomes low level. Due to the low-level voltage at the reference signal terminal VSS, the fifth node NET5 is discharged via the nineteenth transistor M19 to ensure that the voltage at the fifth node NET5 is at low level. The fifth and ninth transistors M5 and M9 are turned off under control of the voltage at the first node NET1. The control signal inputted through the input signal terminal INPUT is a low-level signal, so the tenth transistor M10 is turned off under control of the control signal. In addition, because of the on state of the twelfth transistor M12 and the low-level voltage at the input signal terminal INPUT, the first node NET1 can be discharged via the twelfth transistor M12, thereby further improving discharge capability of the shift register.

In the shift register according to the present embodiment, the reset control module pulls up the voltage at the second node by the driving signal outputted through the output signal terminal in the output period and outputs the reset signal to the reset module through the second node in the reset period, and the reset module resets the first node and the output signal terminal under control of the reset signal in the reset period. The shift register in the present embodiment realizes reset function under control of the driving signal outputted through its own output signal terminal, so that the shift register realizes reset function on its own. The shift register in the present embodiment realizes reset function by the driving signal outputted through its own output signal terminal, and thus it needs no dummy signal line to reset the shift register in the last stage, resulting in less complexity of the structure of GOA circuit and less space occupied by the GOA circuit in the display apparatus.

Figure 4:
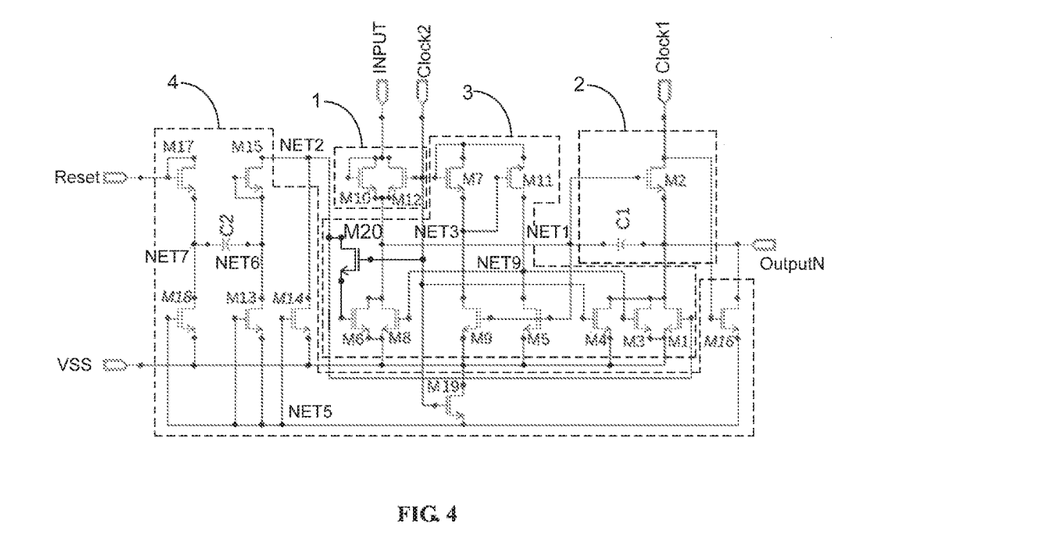
FIG. 4 is a schematic diagram illustrating a structure of a shift register according to an embodiment of the present disclosure.

FIG. 4 is a schematic diagram illustrating a structure of a shift register according to an embodiment of the present disclosure. The shift register illustrated in FIG. 4 differs from the shift register illustrated in FIG. 2 in that it further includes a reset signal terminal Reset, and the reset control module 4 thereof is further connected to the reset signal terminal Reset. The reset control module 4 is further configured to pull up the voltage at the second node NET2 by a reset assistant signal inputted through the reset signal terminal Reset in the reset period, such that the voltage at the second node NET2 in the reset period is not lower than that in the output period.

The reset control module 4 in the present embodiment includes a thirteenth transistor M13, a fourteenth transistor M14, a fifteenth transistor M15, a sixteenth transistor M16, a seventeenth transistor M17, an eighteenth transistor M18 and a second capacitor C2. A control electrode of the thirteenth transistor M13 is connected to a fifth node NET5, a first electrode of the thirteenth transistor M13 is connected to a sixth node NET6, and a second electrode of the thirteenth transistor M13 is connected to the fifth node NET5. A control electrode of the fourteenth transistor M14 is connected to the fifth node NET5, a first electrode of the fourteenth transistor M14 is connected to the second node NET2, and a second electrode of the fourteenth transistor M14 is connected to the reference signal terminal VSS. A control electrode of the fifteenth transistor M15 is connected to the sixth node NET6, a first electrode of the fifteenth transistor M15 is connected to the second node NET2, and a second electrode of the fifteenth transistor M15 is connected to the sixth node NET6. A control electrode of the sixteenth transistor M16 is connected to a first clock signal terminal Clock1, a first electrode of the sixteenth transistor M16 is connected to the output signal terminal OutputN, and a second electrode of the sixteenth transistor M16 is connected to the fifth node NET5. A control electrode of the seventeenth transistor M17 is connected to the reset signal terminal Reset, a first electrode of the seventeenth transistor M17 is connected to the reset signal terminal Reset, and a second electrode of the seventeenth transistor M17 is connected to a seventh node NET7. A control electrode of the eighteenth transistor M18 is connected to the fifth node NET5, a first electrode of the eighteenth transistor M18 is connected to the seventh node NET7, and a second electrode of the eighteenth transistor M18 is connected to the reference signal terminal VSS. A first end of the second capacitor C2 is connected to the seventh node NET7 and a second end of the second capacitor C2 is connected to the sixth node NET6.

Descriptions of the remaining structures of the shift register in the present embodiment are the same as the above description with reference to FIG. 2 and are omitted herein.

Figure 5:
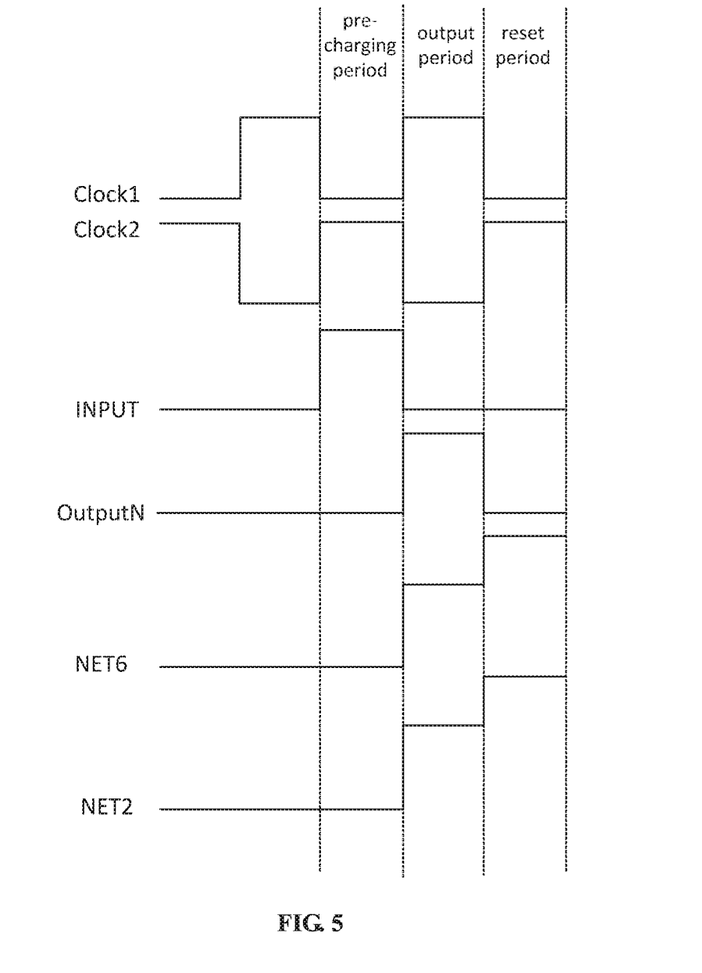
FIG. 5 is a schematic diagram illustrating a timing of the shift register of FIG. 4 in an operating mode.

FIG. 5 is a schematic diagram illustrating a timing of the shift register of FIG. 4 in an operating mode. Hereinafter, an operating process of the shift register according to the present embodiment will be described in detail with reference to FIGS. 4 and 5.

In the pre-charging period, the tenth transistor M10 is turned on under control of the control signal inputted through the input signal terminal INPUT, wherein the input signal terminal INPUT may be connected with the output signal terminal Output(N−1) of the shift register in the previous stage, and in this case, the control signal is the driving signal outputted through the output signal terminal Output(N−1) of the shift register in the previous stage, which is a high-level signal. It should be noted that in a case where the current shift register is a shift register in the first stage, the input signal terminal INPUT thereof may be connected with a start vertical (STV) signal terminal of the GOA circuit, and in this case, the control signal may be a STV signal outputted through the STV signal terminal. In this period, the second clock signal inputted through the second clock signal terminal Clock2 is a high-level signal, and the twelfth transistor M12, the seventh transistor M7, the fourth transistor M4, the nineteenth transistor M19 and the twentieth transistor M20 are turned on under control of the second clock signal. Due to the on state of the tenth and twelfth transistors M10 and M12, the first capacitor C1 is charged via the tenth and twelfth transistors M10 and M12 from the input signal terminal INPUT, so that the voltage at the first node NET1 is pulled up and the second, fifth and ninth transistors M2, M5 and M9 are turned on under control of the voltage at the first node NET1. In the present embodiment, the twelfth transistor M12 is provided to improve the signal writing capability of the input signal terminal INPUT. Since the second clock signal is at high level and the seventh transistor M7 is turned on, the voltage at the third node NET3 is at high level, and the eleventh transistor M11 is turned on under control of the voltage at the third node NET3. Since the voltage at the reference signal terminal VSS is at low level and the fifth transistor M5 is turned on, the ninth node NET9 is discharged via the fifth transistor M5. In this case, a width-to-length ratio of the fifth transistor M5 is appropriately set (for example, the width-to-length ratio of the fifth transistor M5 is set to be much larger than that of the eleventh transistor M11) to ensure that a voltage at the ninth node NET9 is pulled down to low level by the fifth transistor M5 and the third and eighth transistors M3 and M8 are turned off under control of the voltage at the ninth node NET9. Although the second transistor M2 is turned on, a voltage at the output signal terminal OutputN is at low level due to the fact that the first clock signal inputted through the first clock signal terminal Clock1 is a low-level signal. The voltage at the reference signal terminal VSS is at low level, and thus the output signal terminal OutputN is discharged via the fourth transistor M4 that is turned on to ensure that the voltage at the output signal terminal OutputN is at low level. The eighth transistor M8 is turned off to not discharge the first node NET1, so it ensures that the voltage at the first node NET1 is at high level. Due to the low level of the first clock signal inputted through the first clock signal terminal Clock1, the sixteenth transistor M16 is turned off, and thus the voltage at the fifth node NET5 is at low level and the thirteenth, fourteenth and eighteenth transistors M13, M14 and M18 are turned off. The voltage at the sixth node NET6 is at low level as well, and thus the fifteenth transistor M15 is turned off. The reset assistant signal inputted through the reset signal terminal Reset is a low-level signal, so the seventeenth transistor M17 is turned off and the voltage at the seventh node NET7 is at low level. Although the twentieth transistor M20 is turned on, the sixth transistor M6 is turned off due to the low level of the voltage at the second node NET2. The first transistor M1 is turned off due to the low level of the voltage at the second node NET2. Due to the low level of the voltage at the reference signal terminal VSS, the fifth node NET5 is discharged via the nineteenth transistor M19 that is turned on to ensure that the voltage at the fifth node NET5 is at low level.

In the output period, the second transistor M2 remains on under control of the voltage at the first node NET1, and the first clock signal outputted through the first clock signal terminal Clock1 is at high level to pull up the voltage at the output signal terminal OutputN to high level, so the voltage at the first node NET1 is increased due to the bootstrapping effect. Therefore, a driving signal of high level is outputted through the output signal terminal OutputN. The sixteenth transistor M16 is turned on under control of the first clock signal, and the voltage at the fifth node NET5 is at high level because the driving signal outputted through the output signal terminal OutputN is a high-level signal. The thirteenth, fourteenth and eighteenth transistors M13, M14 and M18 are turned on under control of the voltage at the fifth node NET5, and in this case, the second capacitor C2 is charged via the thirteenth transistor M13 such that the voltage at the sixth node NET6 is at high level. At this moment, the voltage at the reference signal terminal VSS is at low level, so the voltage at the seventh node NET7 is at low level to ensure the high level of the voltage at the sixth node NET6. The fifteenth transistor M15 is turned on under control of the sixth node NET6 such that the voltage at the second node NET2 is at high level. In the present embodiment, the voltages at the sixth node NET6 and the second node NET2 can be controlled by setting a width-to-length ratio W/L of the fourteenth transistor M14. Due to the low level of the reset assistant signal inputted through the reset signal terminal Reset, the seventeenth transistor M17 is turned off and the voltage at the seventh node NET7 is at low level. The control signal inputted through the input signal terminal INPUT is a low-level signal, and thus the tenth transistor M10 is turned off under control of the control signal. Due to the low level of the second clock signal inputted through the second clock signal terminal Clock2, the twelfth transistor M12, the seventh transistor M7, the fourth transistor M4, the nineteenth transistor M19 and the twentieth transistor M20 are turned off under control of the second clock signal. The voltage at the third node NET3 is at low level due to the off state of the seventh transistor M7, so the eleventh transistor M11 is turned off under control of the voltage at the third node NET3. The fifth and ninth transistors M5 and M9 remain on under control of the voltage at the first node NET1, the voltage at the reference signal terminal VSS is at low level, the voltage at the ninth node NET9 is at low level, and the third and eighth transistors M3 and M8 are turned off under control of the voltage at the ninth node NET9. Although the voltage at the second node NET2 is at high level, the sixth transistor M6 is not turned on by the voltage at the second node NET2 due to the off of the twentieth transistor M20, i.e., the sixth transistor M6 is in the off state. The first transistor M1 is turned on under control of the voltage at the second node NET2. Although the output signal terminal OutputN is somewhat discharged via the first transistor M1, the voltage at the output signal terminal OutputN is not affected by the discharge because the on-resistance of the first transistor M1 is larger than that of the second transistor M2.

In the reset period, the first clock signal inputted through the first clock signal terminal Clock1 is at low level, the sixteenth transistor M16 is turned off under control of the first clock signal, and at this moment, the driving signal outputted through the output signal terminal OutputN is a low-level signal. The voltage at the fifth node NET5 is at low level due to the off state of the sixteenth transistor M16. The thirteenth, fourteenth and eighteenth transistors M13, M14 and M18 are turned off under control of the voltage at the fifth node NET5. The voltage at the sixth node NET6 is maintained at high level by the second capacitor C2. The seventeenth transistor M17 is turned on under control of the reset assistant signal inputted through the reset signal terminal Reset, wherein the reset signal terminal Reset may be connected to an output signal terminal Output(N+1) of the shift register in the next stage, and in this case, the reset assistant signal is a driving signal outputted through the output signal terminal Output(N+1) of the shift register in the next stage, which is a high-level signal. It should be noted that in a case where the shift register is a shift register in the last stage, the reset signal terminal Reset may be connected to a dummy signal line, and the reset assistant signal is a dummy signal outputted through the dummy signal line. The voltage at the seventh node NET7 is at high level due to the high level of the reset assistant signal, so the voltage at the sixth node NET6 is pulled up due to the bootstrapping effect. The fifteenth transistor M15 remains on under control of the voltage at the sixth node NET6, so that the voltage at the second node NET2 is pulled up, and the voltage at the sixth node NET6 is the same as the voltage at the second node NET2. The second clock signal outputted through the second clock signal terminal Clock2 is a high-level signal, and the twelfth transistor M12, the seventh transistor M7, the fourth transistor M4, the nineteenth transistor M19 and the twentieth transistor M20 are turned on under control of the second clock signal. Due to the on state of the twentieth transistor M20, a reset signal of high level is outputted from the second node NET2 to the sixth transistor M6 via the twentieth transistor M20. The sixth transistor M6 is turned on under control of the reset signal, that is, the sixth transistor M6 is turned on under control of the voltage at the second node NET2. The reset signal of high level is outputted from the second node NET2 to the sixth transistor M6, and the first transistor M1 is turned on under control of the reset signal, that is, the first transistor M1 is turned on under control of the voltage at the second node NET2. Due to the on state of the seventh transistor M7, the voltage at the third node NET3 is at high level, the eleventh transistor M11 is turned on under control of the voltage at the third node NET3, and thus the voltage at the ninth node NET9 is at high level. The third and eighth transistors M3 and M8 are turned on under control of the voltage at the ninth node NET9. The voltage at the reference signal terminal VSS is at low level, the first node NET1 is discharged via the sixth and eighth transistors M6 and M8 such that the voltage at the first node NET1 becomes low level, and the output signal terminal OutputN is discharged via the first, third and fourth transistors M1, M3 and M4 such that the voltage at the output signal terminal OutputN becomes low level. Due to the low-level voltage at the reference signal terminal VSS, the fifth node NET5 is discharged via the nineteenth transistor M19 to ensure that the voltage at the fifth node NET5 is at low level. The fifth and ninth transistors M5 and M9 are turned off under control of the voltage at the first node NET1.

In the shift register according to the present embodiment, the reset control module pulls up the voltage at the second node by the driving signal outputted through the output signal terminal in the output period and outputs the reset signal to the reset module through the second node in the reset period, and the reset module resets the first node and the output signal terminal under control of the reset signal in the reset period. The shift register in the present embodiment realizes reset function under control of the driving signal outputted through its own output signal terminal, so that the shift register realizes reset function on its own. In the present embodiment, the reset control module pulls up the voltage at the second node by the reset assistant signal inputted through the reset signal terminal in the reset period, which further improves discharge capability of the shift register and results in faster reset, thereby further improving switching capability of pixels.

An embodiment of the present disclosure provides a GOA circuit including a plurality of shift registers cascaded in a multi-stage series, wherein the shift registers are shift registers described with reference to FIG. 1, 2 or 4.

In the GOA circuit according to the present embodiment, the reset control module pulls up the voltage at the second node by the driving signal outputted through the output signal terminal in the output period and outputs the reset signal to the reset module through the second node in the reset period, and the reset module resets the first node and the output signal terminal under control of the reset signal in the reset period. Each shift register of the GOA circuit in the present embodiment realizes reset function under control of the driving signal outputted through its own output signal terminal, so that the shift register realizes reset function on its own.

An embodiment of the present disclosure provides a display apparatus including the above-described GOA circuit.

In the display apparatus according to the present embodiment, the reset control module pulls up the voltage at the second node by the driving signal outputted through the output signal terminal in the output period and outputs the reset signal to the reset module through the second node in the reset period, and the reset module resets the first node and the output signal terminal under control of the reset signal in the reset period. Each shift register of the GOA circuit of the display apparatus in the present embodiment realizes reset function under control of the driving signal outputted through its own output signal terminal, so that the shift register realizes reset function on its own.

An embodiment of the present disclosure provides a driving method of a shift register, wherein the shift register includes a pre-charging module, an output module, a reset module and a reset control module, the pre-charging module is connected to a first node, the output module is connected to the first node and an output signal terminal, the reset module is connected to a second node, the first node and the output signal terminal, and the reset control module is connected to a second node and the output signal terminal;

the driving method includes:

in a pre-charging period, charging the first node by the pre-charging module;

in an output period, pulling up a voltage at the first node and outputting a driving signal through the output signal terminal by the output module, and pulling up a voltage at the second node by the reset control module through the driving signal outputted through the output signal terminal; and in a reset period, outputting, by the reset control module, the voltage at the second node pulled up in the output period to the reset module as a reset signal, and resetting the first node and the output signal terminal by the reset module under control of the reset signal.

The driving method of a shift register according to the present embodiment may be used to drive the shift register described with reference to FIG. 1 or 2.

In the driving method of a shift register according to the present embodiment, the reset control module pulls up the voltage at the second node by the driving signal outputted through the output signal terminal in the output period and outputs the reset signal to the reset module through the second node in the reset period, and the reset module resets the first node and the output signal terminal under control of the reset signal in the reset period. In the driving method of a shift register in the present embodiment, the shift register realizes reset function under control of the driving signal outputted through its own output signal terminal, so that the shift register realizes reset function on its own.

An embodiment of the present disclosure provides a driving method of a shift register, wherein the shift register includes a pre-charging module, an output module, a reset module and a reset control module, the pre-charging module is connected to a first node, the output module is connected to the first node and an output signal terminal, the reset module is connected to a second node, the first node and the output signal terminal, and the reset control module is connected to a second node, the output signal terminal and a reset signal terminal;

the driving method includes:

in a pre-charging period, charging the first node by the pre-charging module;

in an output period, pulling up a voltage at the first node and outputting a driving signal through the output signal terminal by the output module, and pulling up a voltage at the second node by the reset control module through the driving signal outputted through the output signal terminal; and in a reset period, pulling up, by the reset control module, the voltage at the second node through a reset assistant signal inputted through the reset signal terminal such that the voltage at the second node in the reset period is not lower than the voltage at the second node in the output period, outputting a reset signal to the reset module by the reset control module through the second node, and resetting the first node and the output signal terminal by the reset module under control of the reset signal.

The driving method of a shift register according to the present embodiment may be used to drive the shift register described with reference to FIG. 1 or 4.

In the driving method of a shift register according to the present embodiment, the reset control module pulls up the voltage at the second node by the driving signal outputted through the output signal terminal in the output period and outputs the reset signal to the reset module through the second node in the reset period, and the reset module resets the first node and the output signal terminal under control of the reset signal in the reset period. In the driving method of a shift register in the present embodiment, the shift register realizes reset function under control of the driving signal outputted through its own output signal terminal, so that the shift register realizes reset function on its own. In the present embodiment, the reset control module pulls up the voltage at the second node by the reset assistant signal inputted through the reset signal terminal in the reset period, which further improves discharge capability of the shift register and results in faster reset, thereby further improving switching capability of pixels.

It can be understood that the foregoing implementations are merely exemplary implementations used for describing the principle of the present disclosure, but the present disclosure is not limited thereto. Those ordinary skilled in the art may make various variations and improvements without departing from the spirit and essence of the present disclosure, and these variations and improvements shall fall into the protection scope of the present disclosure.

What is claimed is:

1. A shift register, comprising a pre-charging module, an output module, a reset module and a reset control module, the pre-charging module being connected to a first node, the output module being connected to the first node and an output signal terminal, the reset module being connected to a second node, the first node and the output signal terminal, and the reset control module being connected to the second node and the output signal terminal, wherein the pre-charging module is configured to charge the first node in a pre-charging period;

the output module is configured to pull up a voltage at the first node and output a driving signal through the output signal terminal in an output period;

the reset control module is configured to pull up a voltage at the second node by the driving signal outputted through the output signal terminal in the output period and output the voltage at the second node pulled up in the output period to the reset module as a reset signal in a reset period; and the reset module is configured to reset the first node and the output signal terminal under control of the reset signal in the reset period.

2. The shift register according to claim 1, wherein the reset control module comprises a thirteenth transistor, a fourteenth transistor, a fifteenth transistor, a sixteenth transistor and a second capacitor;

a control electrode of the thirteenth transistor is connected to a fifth node, a first electrode of the thirteenth transistor is connected to a sixth node, and a second electrode of the thirteenth transistor is connected to the fifth node;

a control electrode of the fourteenth transistor is connected to the fifth node, a first electrode of the fourteenth transistor is connected to the second node, and a second electrode of the fourteenth transistor is connected to a reference signal terminal;

a control electrode of the fifteenth transistor is connected to the sixth node, a first electrode of the fifteenth transistor is connected to the second node, and a second electrode of the fifteenth transistor is connected to the sixth node;

a control electrode of the sixteenth transistor is connected to a first clock signal terminal, a first electrode of the sixteenth transistor is connected to the output signal terminal, and a second electrode of the sixteenth transistor is connected to the fifth node; and a first end of the second capacitor is connected to the reference signal terminal and a second end of the second capacitor is connected to the sixth node.

3. The shift register according to claim 1, wherein the reset control module is further connected to a reset signal terminal; and the reset control module is further configured to pull up the voltage at the second node by a reset assistant signal inputted through the reset signal terminal in the reset period, such that the voltage at the second node in the reset period is not lower than the voltage at the second node in the output period.

4. The shift register according to claim 3, wherein the reset control module includes a thirteenth transistor, a fourteenth transistor, a fifteenth transistor, a sixteenth transistor, a seventeenth transistor, an eighteenth transistor and a second capacitor;

a control electrode of the thirteenth transistor is connected to a fifth node, a first electrode of the thirteenth transistor is connected to a sixth node, and a second electrode of the thirteenth transistor is connected to the fifth node;

a control electrode of the fourteenth transistor is connected to the fifth node, a first electrode of the fourteenth transistor is connected to the second node, and a second electrode of the fourteenth transistor is connected to a reference signal terminal;

a control electrode of the fifteenth transistor is connected to the sixth node, a first electrode of the fifteenth transistor is connected to the second node, and a second electrode of the fifteenth transistor is connected to the sixth node;

a control electrode of the sixteenth transistor is connected to a first clock signal terminal, a first electrode of the sixteenth transistor is connected to the output signal terminal, and a second electrode of the sixteenth transistor is connected to the fifth node;

a control electrode of the seventeenth transistor is connected to the reset signal terminal, a first electrode of the seventeenth transistor is connected to the reset signal terminal, and a second electrode of the seventeenth transistor is connected to a seventh node;

a control electrode of the eighteenth transistor is connected to the fifth node, a first electrode of the eighteenth transistor is connected to the seventh node, and a second electrode of the eighteenth transistor is connected to the reference signal terminal; and a first end of the second capacitor is connected to the seventh node and a second end of the second capacitor is connected to the sixth node.

5. The shift register according to claim 2, wherein the reset control module further comprises a nineteenth transistor, and a control electrode of the nineteenth transistor is connected to a second clock signal terminal, a first electrode of the nineteenth transistor is connected to the reference signal terminal, and a second electrode of the nineteenth transistor is connected to the fifth node.

6. The shift register according to claim 4, wherein the reset control module further comprises a nineteenth transistor, and a control electrode of the nineteenth transistor is connected to a second clock signal terminal, a first electrode of the nineteenth transistor is connected to the reference signal terminal, and a second electrode of the nineteenth transistor is connected to the fifth node.

7. The shift register according to claim 1, wherein the reset module comprises a first transistor, a third transistor, a fourth transistor, a fifth transistor, a sixth transistor, a seventh transistor, an eighth transistor, a ninth transistor, an eleventh transistor and a twentieth transistor;

a control electrode of the first transistor is connected to the second node, a first electrode of the first transistor is connected to the output signal terminal, and a second electrode of the first transistor is connected to a reference signal terminal;

a control electrode of the third transistor is connected to a ninth node, a first electrode of the third transistor is connected to the output signal terminal, and a second electrode of the third transistor is connected to the reference signal terminal;

a control electrode of the fourth transistor is connected to a second clock signal terminal, a first electrode of the fourth transistor is connected to the output signal terminal, and a second electrode of the fourth transistor is connected to the reference signal terminal;

a control electrode of the fifth transistor is connected to the first node, a first electrode of the fifth transistor is connected to the ninth node, and a second electrode of the fifth transistor is connected to the reference signal terminal;

a control electrode of the sixth transistor is connected to a second electrode of the twentieth transistor, a first electrode of the sixth transistor is connected to the first node, and a second electrode of the sixth transistor is connected to the reference signal terminal;

a control electrode of the seventh transistor is connected to the second clock signal terminal, a first electrode of the seventh transistor is connected to the second clock signal terminal, and a second electrode of the seventh transistor is connected to a third node;

a control electrode of the eighth transistor is connected to the ninth node, a first electrode of the eighth transistor is connected to the first node, and a second electrode of the eighth transistor is connected to the reference signal terminal;

a control electrode of the ninth transistor is connected to the first node, a first electrode of the ninth transistor is connected to the third node, and a second electrode of the ninth transistor is connected to the reference signal terminal;

a control electrode of the eleventh transistor is connected to the third node, a first electrode of the eleventh transistor is connected to the second clock signal terminal, and a second electrode of the eleventh transistor is connected to the ninth node; and a control electrode of the twentieth transistor is connected to the second clock signal terminal, a first electrode of the twentieth transistor is connected to the second node, and the second electrode of the twentieth transistor is connected to the control electrode of the sixth transistor.

8. The shift register according to claim 1, wherein the output module comprises a second transistor and a first capacitor;
a control electrode of the second transistor is connected to the first node, a first electrode of the second transistor is connected to a first clock signal terminal, and a second electrode of the second transistor is connected to the output signal terminal;
a first end of the first capacitor is connected to the first node, and a second end of the first capacitor is connected to the output signal terminal.

9. The shift register according to claim 1, wherein the pre-charging module comprises a tenth transistor and a twelfth transistor;
a control electrode of the tenth transistor is connected to an input signal terminal, a first electrode of the tenth transistor is connected to the input signal terminal, and a second electrode of the tenth transistor is connected to the first node; and
a control electrode of the twelfth transistor is connected to a second clock signal terminal, a first electrode of the twelfth transistor is connected to the input signal terminal, and a second electrode of the twelfth transistor is connected to the first node.

10. A gate on array circuit, comprising a plurality of shift registers cascaded in a multi-stage series, each of the shift registers being the shift register according to claim 1.

11. A gate on array circuit, comprising a plurality of shift registers cascaded in a multi-stage series, each of the shift registers being the shift register according to claim 2.

12. A gate on array circuit, comprising a plurality of shift registers cascaded in a multi-stage series, each of the shift registers being the shift register according to claim 3.

13. A gate on array circuit, comprising a plurality of shift registers cascaded in a multi-stage series, each of the shift registers being the shift register according to claim 4.

14. A gate on array circuit, comprising a plurality of shift registers cascaded in a multi-stage series, each of the shift registers being the shift register according to claim 5.

15. A gate on array circuit, comprising a plurality of shift registers cascaded in a multi-stage series, each of the shift registers being the shift register according to claim 6.

16. A display apparatus, comprising the gate on array circuit according to claim 10.

17. A driving method of a shift register, wherein the shift register comprises a pre-charging module, an output module, a reset module and a reset control module, the pre-charging module being connected to a first node, the output module being connected to the first node and an output signal terminal, the reset module being connected to a second node, the first node and the output signal terminal, and the reset control module being connected to a second node and the output signal terminal;
the driving method comprises:
in a pre-charging period, charging the first node by the pre-charging module;
in an output period, pulling up a voltage at the first node and outputting a driving signal through the output signal terminal by the output module, and pulling up a voltage at the second node by the reset control module through the driving signal outputted through the output signal terminal; and
in a reset period, outputting, by the reset control module, the voltage at the second node pulled up in the output period to the reset module as a reset signal, and resetting the first node and the output signal terminal by the reset module under control of the reset signal.

18. The driving method according to claim 17, wherein the reset control module is further connected to a reset signal terminal; and
the driving method further comprises, before outputting the reset signal to the reset module through the second node by the reset control module:
in the reset period, pulling up, by the reset control module, the voltage at the second node through a reset assistant signal inputted through the reset signal terminal, such that the voltage at the second node in the reset period is not lower than the voltage at the second node in the output period.

19. The driving method according to claim 17, wherein the pre-charge period, the output period and the reset period are three periods sequential and consecutive in time.

* * * * *